(12) United States Patent
Reiss et al.

(10) Patent No.: US 7,368,322 B2
(45) Date of Patent: May 6, 2008

(54) METHOD FOR MOUNTING A CHIP ON A BASE AND ARRANGEMENT PRODUCED BY THIS METHOD

(75) Inventors: Martin Reiss, Dresden (DE); Juergen Grafe, Dresden (DE); Anton Legen, Munich (DE); Manuel Carmona, Barcelona (ES)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/184,532

(22) Filed: Jul. 19, 2005

(65) Prior Publication Data

US 2006/0017156 A1 Jan. 26, 2006

(30) Foreign Application Priority Data

Jul. 19, 2004 (DE) .................. 10 2004 034 884
Mar. 31, 2005 (DE) .................. 10 2005 015 036

(51) Int. Cl.
*H01L 21/00* (2006.01)

(52) U.S. Cl. .................. 438/118; 438/106; 438/127; 257/E21.001

(58) Field of Classification Search .......... 438/109, 438/118, 119; 257/777, 782, 783
See application file for complete search history.

(56) References Cited

U.S. PATENT DOCUMENTS

| | | | |
|---|---|---|---|
| 6,130,116 A | 10/2000 | Smith et al. | |
| 6,218,731 B1 * | 4/2001 | Huang et al. | 257/738 |
| 6,300,254 B1 | 10/2001 | Raab | |
| 6,558,975 B2 * | 5/2003 | Sugino et al. | 438/64 |
| 6,607,970 B1 * | 8/2003 | Wakabayashi | 438/462 |
| 6,784,555 B2 | 8/2004 | Watson | |
| 6,930,378 B1 * | 8/2005 | St. Amand et al. | 257/686 |
| 6,960,491 B2 * | 11/2005 | Lin et al. | 438/108 |
| 6,969,914 B2 * | 11/2005 | Fuller et al. | 257/780 |
| 6,992,380 B2 * | 1/2006 | Masumoto | 257/709 |
| 7,002,257 B2 * | 2/2006 | Tao et al. | 257/787 |
| 2002/0096751 A1 | 7/2002 | Chen et al. | |
| 2002/0159773 A1 | 10/2002 | Kodama et al. | |
| 2002/0171142 A1 | 11/2002 | Kinsman | |
| 2002/0197771 A1 * | 12/2002 | Dotta et al. | 438/114 |
| 2003/0160312 A1 | 8/2003 | Lo et al. | |
| 2005/0064630 A1 | 3/2005 | Zacherl et al. | |

FOREIGN PATENT DOCUMENTS

| | | |
|---|---|---|
| DE | 10133361 | 1/2003 |
| DE | 102 01 204 A1 | 7/2003 |
| JP | 60-243180 | 12/1985 |
| JP | 61-138680 | 6/1986 |
| WO | WO 01/09939 A1 | 2/2001 |
| WO | WO 03/025080 A1 | 3/2003 |
| WO | WO 03/025081 A1 | 3/2003 |

* cited by examiner

*Primary Examiner*—Michael Lebentritt
*Assistant Examiner*—Angel Roman
(74) *Attorney, Agent, or Firm*—Slater & Matsil, L.L.P.

(57) ABSTRACT

An electronic component includes a base and a chip attached to the base by a plurality of adhesive pads that are spaced apart from one another and are arranged in an intermediate space between the chip and the base. The chip is electrically connected to interconnects of the base. The adhesive pads are partitioned in a regular distribution over the entire surface area of the chip. A molding compound surrounds the chip and is disposed in the intermediate space between the chip and the base.

24 Claims, 3 Drawing Sheets

METHOD FOR MOUNTING A CHIP ON A BASE AND ARRANGEMENT PRODUCED BY THIS METHOD

This application claims priority to German Patent Application 10 2004 034 884.7, which was filed Jul. 19, 2004 and to German Patent Application 10 2005 015 036.5, which was filed Mar. 31, 2005, both of which are incorporated herein by reference.

TECHNICAL FIELD

The invention relates generally to packaged electronic components and more particularly to a method for mounting a chip on a base and an arrangement produced by this method.

BACKGROUND

In the case of BGA (Ball Grid Array) or FBGA (Fine Ball Grid Array) packages, problems occur with respect to module reliability, in particular under exposure to changing temperatures. The reason for this can be seen in the different materials used and the resultant different coefficients of expansion, which, although reduced by appropriate material selection, cannot be eliminated.

In addition, the materials used, such as the molding compound, the substrate, the adhesives, etc., absorb water vapor from the surroundings, which depends in part on the ambient conditions and also on the storage times. This causes thermal stresses and stresses induced by the water vapor to occur between the individual components (chip, substrate, molding compound, solder balls). It is possible, that the forces acting on individual interfaces between the materials will reach critical values, which may lead to crack formation and partial or complete delamination (e.g., popcorning) of the package.

In detail, the package contains a chip, for example with at least one central row of bonding pads, the chip being attached on a substrate by means of an adhesive or else a tape (adhesive strip). The substrate, for example a single-layer or multi-layer glass fiber laminate, also referred to as a PCB (Printed Circuit Board), is provided on the side facing away from the chip with solder balls, which are mounted on contacts on the substrate. These contacts are electrically connected by means of interconnects to bonding islands, which are arranged laterally next to a bonding channel in the substrate. The electrical connection of the bonding pads on the chip to the bonding islands on the substrate takes place by wire bridges, which are drawn through the bonding channel. This bonding channel is sealed with a sealing compound after the electrical connections have been established. Furthermore, the chip side is enclosed by a molding compound, which also partly covers the substrate in order to protect the back side and the sensitive chip edges.

Substrate-based BGA packages of this type are usually constructed in such a way that the adhesive area provided for the chip mounting is aligned in a way corresponding to the chip size, in order to ensure secure attachment of the chip on the substrate. In this case, there are different versions with a slight adhesive set-back or projection with respect to the chip.

Particularly disadvantageous in the case of these substrate-based packages is the fact that the adhesive in particular (D/A material) and also the substrate can absorb a relatively large amount of moisture, with the result that the finished package only has a limited reliability, and at present it is usually only possible to achieve MSL3, that is Moisture Sensitivity Level 3. This means that, before soldering with a lead-free solder, the package first has to be heat-treated for a longer time at temperatures around 120° C. in order first to remove the moisture present in the package.

The aim is therefore to achieve Moisture Sensitivity Level 1, at which the package can be immediately soldered right away, without a so-called popcorn effect and resultant detachment of the molding compound and/or the chip from the substrate having to be feared.

In order to achieve favorable conditions here, a composition for an adhesive film that has a particularly high heat resistance and high resistance to moisture absorption is described in U.S. Patent Application Publication 2002/0159773 A1.

Furthermore, Japanese Patent Publications JP 243180/1985 and JP 138680/1986 disclose a printed circuit board material with improved vapor resistance, in which acrylic and epoxy adhesives and also urethane adhesive are used together with an inorganic filler.

However, these measures are not adequate to achieve MSL1. This is caused by the continuing high proportion of D/A material within the package, which can absorb a great amount of water in comparison with the molding compound. The consequence is the so-called popcorn effect, i.e., significant delamination after the preconditioning (storage in humid conditions and simulation of soldering).

The aforementioned problem is countered by a solution according to German Patent Publication DE 101 33 361 C2. In this document, it is proposed that the chip should not be adhesively attached to the substrate over its full surface area but that instead adhesive webs, adhesive strips or adhesive spots should be applied to the carrier substrate to form an adhesive layer, the adhesive consisting of a thermosetting adhesive. In this way, the chip is mounted on the carrier substrate with an intermediate space between the chip and the carrier substrate. However, an adhesive of this type is, by its nature, not yet mechanically stable. Solidifying of the adhesive spots, and with it mechanical stability, is only achieved by introducing a molding compound into the intermediate space between the chip and the carrier substrate and subsequent heating of this molding compound to a temperature which lies above the setting temperature of the adhesive. This does in fact reduce the use of adhesive under the chip; however, there are problems with coplanarity between the chip surface and the carrier substrate. This is so because, until the adhesive layer has set, it is still mechanically movable. If a displacement of the surface of the chip then occurs as a result of filling with the molding compound or other mechanical influences, this surface is no longer planar in relation to the carrier substrate. This is of considerable disadvantage for the subsequent processing processes. In particular, coplanarity is required for the construction of stacks, i.e., a stack of semiconductor chips.

In a similar way, the application of a layer of elastomer material to a substrate is disclosed in PCT Publication WO 01/09939 A1. This layer is pressed onto the substrate in the form of a film. After that, the semiconductor chip is pressed onto the film. Finally, the structure created by it is exposed to a relatively high temperature, to ensure that the semiconductor chip is firmly connected to the substrate. Here, on the one hand, it is likewise not ensured that surface displacements, and with them a risk to coplanarity, will not occur nevertheless when the chip is pressed onto the film. On the other hand, it is always necessary that the processes of applying an adhesive film and positioning a semiconductor chip on the carrier substrate are in close proximity in space and time. This virtually rules out fabrication in the wafer assembly, for instance.

SUMMARY OF THE INVENTION

In a first embodiment, the invention relates to a method for mounting a chip on a base in which a multiplicity of adhesive pads that are spaced apart from one another are introduced between the substrate and the base. The adhesive pads are used to connect the chip to the base while setting an intermediate space between the chip and the base. The chip is electrically connected to interconnects of the base. Subsequently, the chip and the base are provided with a molding compound, the intermediate space between the chip and the base being filled with molding compound.

In other embodiments, the invention relates to an arrangement produced by the method noted above. A base and a chip are attached by a multiplicity of adhesive pads that are spaced apart from one another are arranged in an intermediate space between the chip and the base. In this case, the chip is electrically connected to interconnects of the base and the chip and the base are provided with a molding compound, the intermediate space between the chip and the base being filled with molding compound.

One embodiment of the invention arranges a mechanical connection between a chip and a base with a number of adhesive pads during the production process with high dimensional stability and to ensure a high degree of coplanarity between the chip and the base. For example, the invention can provide dimensional stability and coplanarity for the production of stacks with a number of chips.

A first embodiment of the invention provides the method of mounting a chip on a base. Adhesive pads, e.g., formed from a pasty thermosetting adhesive, are applied to the side of the chip facing the base or to the side of the base facing the chip. The adhesive pads are made to solidify in a first heat-treatment step at a first temperature, which is specific to the adhesive material and at which the adhesive solidifies without losing its adhesive properties. The chip is placed on the base and aligned to make it coplanar in relation to the base by means of a bonding tool. While applying a bonding force, the adhesive pads are exposed to a second temperature, which is specific to the adhesive material and at which the adhesive pads respectively bond with the previously not yet connected side. The adhesive pads are made to set in a second heat-treatment step at a third temperature, which is specific to the adhesive material and at which the adhesive completely solidifies, firmly connecting the chip to the base. The stack, which comprises at least one chip and one base, is provided with the molding compound, with the molding compound penetrating into the intermediate spaces between the chip and the base.

With these method steps, it is on the one hand, ensured that the base and/or the chip do not necessarily have to be connected to the adhesive pads in spatial or temporal proximity. Since the adhesive pads already have a certain hardness independently of the joining together by the first heat-treatment step, they can already be applied at the beginning of a processing process, as described in more detail below.

The coplanar alignment and the exposure to the second temperature achieve a lamination, in which the adhesive keeps the chip in its coplanar position. It is consequently possible to carry out the second heat-treatment step without a bonding tool and while continuing to ensure coplanarity, which can take place for example in a separate heat-treatment oven, the heat-treatment time of the second heat-treatment step being much longer than the time for adhesive bonding at the second temperature.

In a favorable refinement of the invention, a substrate of a ball grid array is chosen as the base.

It is also possible in principle to use the method in the case of other bases. However, it takes on its preferred positive form in the case of the known ball grid arrays.

Furthermore, in one embodiment of the method, it is provided that a stack with a number of chips is produced. In this case, firstly a first chip is attached on a substrate, which is used as a first base. The first chip is also electrically connected to this first base. This means that the bonding pads on the chip are connected by means of wire bridges to bonding pads on the substrate. After that, at least a second chip is connected to the first chip. In this case, the first chip serves as a second base. This attachment of the first chip on the second chip takes place with the stated process steps up until the second heat-treatment step according to method step b). The second chip is then connected in an electrically conducting manner to the first chip and/or the second base. Only after the last chip has been mounted in this way is the stack provided with the molding compound.

The coplanarity guaranteed in each process step makes it possible to produce correspondingly high packs with a greater number of chips without the chip suffering in its dimensional stability.

It is possible in principle for the first chip to be connected to the substrate in a conventional way, as is known from the known prior art. If the coplanarity of this first connection is adequate, subsequent chips can be added to the stack, it then also being possible to perform a correction of absent coplanarity of the first chip with the further chips. This may take place in particular in that the adhesive pads are exposed to a second temperature when the chip is being pressed on by means of the bonding tool, and thereby become somewhat softer again, so that, with absent coplanarity of the underlying chip, they are deformed to a greater or lesser degree by the bonding tool but the second chip is then again coplanar in relation to the base or the substrate.

In a favorable refinement of the method, however, it is provided that the first chip is already attached in the same way as the second chip up until the second heat-treatment step. Consequently, a connection of the first chip is also produced from the outset, with the advantages of the method according to the invention.

In a refinement of the method, it is provided that the adhesive pads are applied by means of a screen printing process. Since the adhesive material is pasty when the adhesive pads are applied, a sufficiently great accuracy is achieved for the adhesive pads in their geometrical extent by the screen printing process. Furthermore, the screen printing process represents a low-cost process.

Another possible form for the method according to the invention to take is that the adhesive pads are applied by means of a structured tape. In this case, the tape already has the configuration of the adhesive pads.

In a further refinement of the method, the adhesive pads are applied while the chip is still in an assembly with a number of chips on a wafer. With such a form of the method, the effect is achieved that the chips of a wafer are all provided with the adhesive pads at the same time in a highly productive way.

In a refinement of the method in this respect, it is provided that the adhesive pads are applied to the back side of the chips, on which there is no re-routing layer, after a grinding-thin process, the re-routing layer being covered with a protective film while the adhesive pads are applied. The re-routing layer is a layer on the chip which establishes a connection between internal connecting points on the chip and external bonding pads. Usually, a semiconductor chip is thinned in its thickness by a grinding process. For this purpose, the front side of a semiconductor wafer, that is to say the side of the semiconductor wafer where the re-routing layers of the chips lie, is provided with a so-called grinding tape. This grinding tape serves the purpose on the one hand of protecting the re-routing layer and on the other hand of holding the wafer during the grinding process. Accordingly, this grinding tape can serve as a protective film for applying the adhesive pads to the back side of the chips when the grinding-thin process has been completed.

Another possibility is to apply the adhesive pads to the front side of the chips, on which the re-routing layer is located. However, this requires compatibility of the grinding tape with the adhesive pads. On the one hand, this is made possible by the fact that the adhesive pads themselves have a certain stability as a result of the first heat-treatment step. On the other hand, it can be ensured in this way that the unevennesses brought about by the adhesive pads do not lead to a breach in the seal between the grinding tape and the front side of the semiconductor wafer.

In this way, the adhesive pads can also be applied before the application of the grinding tape before a grinding-thin process.

In a further refinement of the method, it is provided that the adhesive pads are applied while the chip is still in an assembly with a number of chips on a carrier film. This is so because, after the grinding, the grinding tape is usually removed from the then ground-thin wafer and a dicing tape is applied to the back side of the wafer, after which the chips are singulated by a separating process. The dicing tape thereby has the task of still keeping the chips in an assembly even when they have been mechanically separated from one another. After this process, the adhesive pads can then be applied.

A further possibility is that the adhesive pads of already singulated chips are individually applied. (Singulated chips are usually referred to as "dies". However, for easier handling of the terms, as a rule the present text refers to "chips".)

When adhesive pads are applied to singulated chips, it is provided that the latter are applied by means of a template to the upper side of the respective base on the stack itself.

On the arrangement side, the invention is achieved by the adhesive pads being partitioned in a regular distribution over the entire surface area of the chip. Such a regular distribution makes it possible for virtually full-area adhesion of the chip on the base to be ensured. The partitioning of the adhesive pads for its part shows the already known advantages of reducing the adhesive compound to avoid ingress of moisture and to avoid thermally induced displacements.

A favorable refinement of the arrangement consists in that the first base comprises a substrate of a ball grid array package. The form of the arrangement on such a substrate will expediently show the advantages according to the invention.

Furthermore, it is expedient for at least some of the adhesive pads to be attached to the chips at locations under bonding pads of the chip. This means that the adhesive pads are positioned at the locations between the chip and the base at which a bonding force occurs during the wire bonding, that is to say when an electrically conducting connection is established between the chip and a base. This arrangement ensures that the bonding forces are transferred to the bases lying underneath without the ground-thin chip being subjected to the bonding forces.

Furthermore, an arrangement according to the invention may be formed in such a way that, when a substrate is used as a first base, in which a bonding channel is arranged for carrying out the electrically conducting connection between the chip and the interconnects of the first base, the adhesive pads are arranged in symmetrical distribution on both sides of the bonding channel. The bonding channel itself produces an instability in the substrate. By arranging the adhesive pads specifically in this region, the stability of the substrate, and with it also the stability of the stack, are increased.

In a further refinement of the invention, it is provided that at least a second chip is arranged on the first chip, which serves as a second base, and the second chip is connected in an electrically conducting manner to the first and/or the second base. The stack, comprising the first base, the first chip and the second chip, is respectively provided as a unit with the molding compound. The arrangement of the adhesive pads that is provided according to the invention achieves a high degree of coplanarity of the chips in relation to their base, and consequently the stacking of the chips to form a stack is possible in a particularly favorable way.

In a further alternative refinement of the arrangement, it is provided that at least a second chip is arranged on the first chip, which serves as a base, but is in turn attached on its base in a different manner than that with which the second chip is attached on the first chip. The second chip is connected in an electrically conducting manner to the first and/or the second base. Here, the stack, comprising the first base, the first chip and the second chip, is likewise again provided as a unit with the molding compound. This arrangement makes it possible for the lowermost chip to be attached on the substrate in a conventional way. In this case, existing technologies can continue to be used. As soon as stacking is to take place, the form of the arrangement according to the invention can be chosen, the further chips lying above the first chip being connected by the adhesive pads to the respectively underlying chip and it consequently being possible to provide compensation for any absent planarity that may occur.

It is expedient furthermore that the patterns of the individual adhesive pads differ between the individual chips. In this way, a distribution of the force within the chip stack is achieved.

With different patterns of individual chips, it may even be advantageous that those neighboring one another have complementary patterns, that is to say that adhesive pads are provided in one pattern specifically where there is a gap in the other pattern. In this way, the supporting function of a semiconductor chip is used and a uniform force distribution is achieved.

It goes without saying that applications in which the patterns of the adhesive pads are deliberately the same from chip to chip are also conceivable. This is advantageous in particular whenever forces are to be passed from one chip to the substrate via a number of chips.

BRIEF DESCRIPTION OF THE DRAWINGS

For a more complete understanding of the present invention, and the advantages thereof, reference is now made to the following descriptions taken in conjunction with the accompanying drawing, in which.

The following list of reference symbols can be used in conjunction with the figures:

| | |
|---|---|
| 1 | chip |
| 2 | adhesive pads |
| 3 | back side |
| 4 | assembly |
| 5 | dicing tape |
| 6 | substrate (base) |
| 7 | bonding tool |
| 8 | bonding pad |
| 9 | second chip |
| 10 | third chip |
| 11 | stack |
| 12 | molding compound |
| 13 | intermediate space |
| 14 | component |
| 15 | exposed substrate side |
| 16 | solder ball |
| $F_B$ | bonding force |

DETAILED DESCRIPTION OF ILLUSTRATIVE EMBODIMENTS

The invention is to be explained in more detail below on the basis of an exemplary embodiment.

Figure 1:
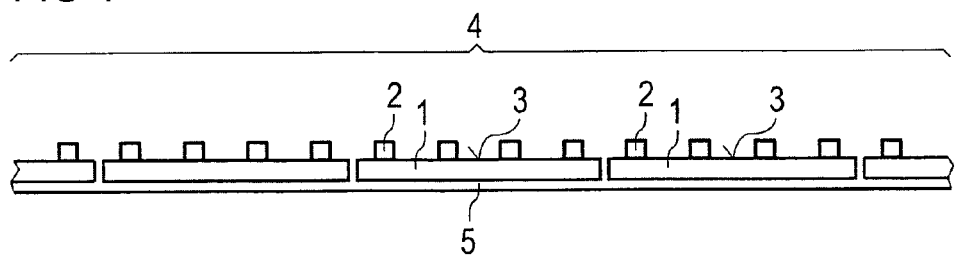
FIG. 1 shows a cross section along the lines I-I in FIG. 2 through an assembly of chips on a dicing tape after separation.

As represented in FIG. 1, adhesive pads 2 are applied to the back side 3 of a chip 1, e.g., by means of a screen printing process. As this happens, the chip 1 is still in the assembly 4 with further chips on a dicing tape 5.

Figure 2:
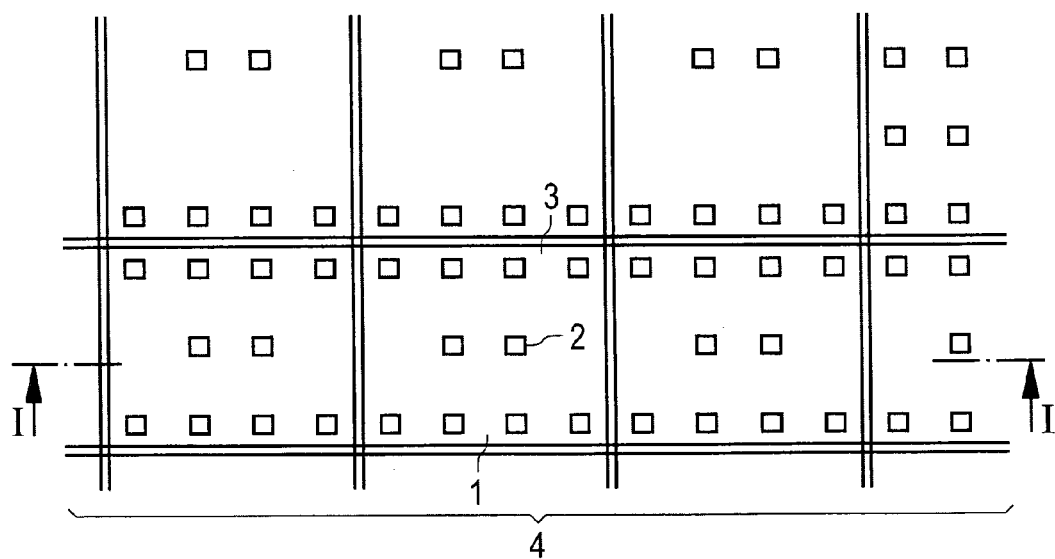
FIG. 2 shows a plan view of the wafer assembly according to FIG. 1, FIGS. 3a to 3e show cross sections of various processing phases of a stack of semiconductor chips.

FIG. 2 shows the plan view of the back side 3 of the semiconductor chips 1 in the assembly 4.

After the adhesive pads 2 have been applied to the chip 1, the adhesive pads are subjected to a first heat-treatment step. They are at this time already solid enough to allow them to be placed on a substrate 6 of a BGA component without undergoing any deformation. The substrate 6 serves as a base for the semiconductor chip 1.

In a next method step, a bonding tool 7 is applied to the chip 1. The bonding tool 7 presses onto the chip 1 with a bonding force $F_B$. As this happens, on the one hand the semiconductor chip 1 is aligned to make it exactly coplanar in relation to the substrate 6. On the other hand, the bonding tool 7 causes heat to be introduced into the chip 1 in such a way that a temperature corresponding to the second temperature is produced in the adhesive pads 2, the adhesive pads bonding with the substrate side.

Figure 3A:
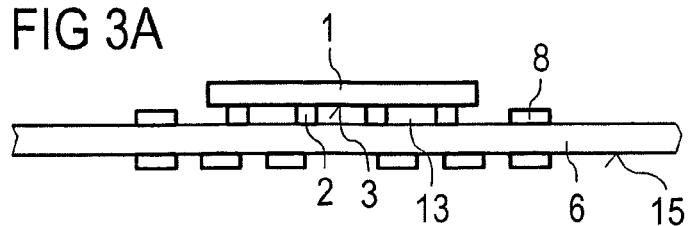
Figure 3B:
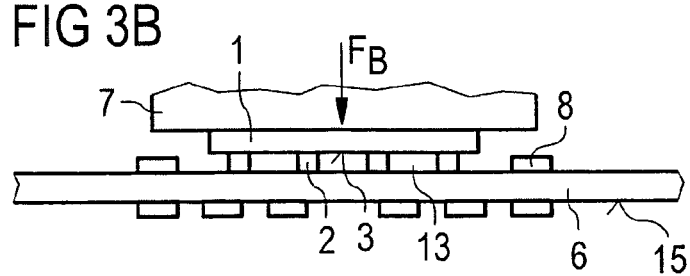
Figure 3C:
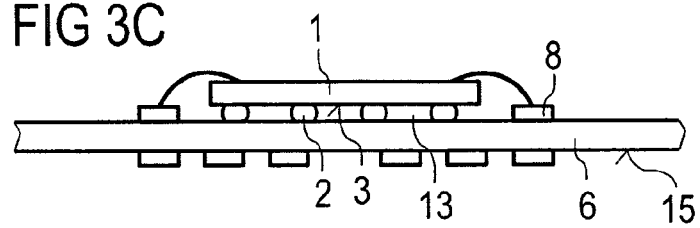
Figure 3D:
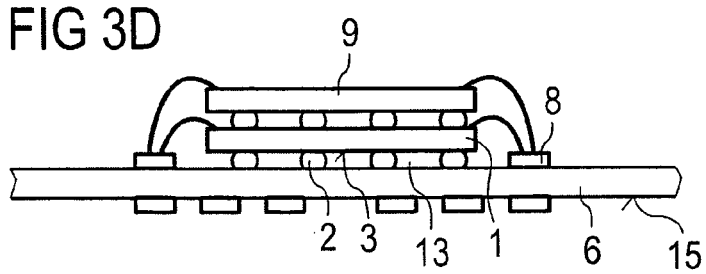

As represented in FIG. 3c, the establishment of an electrically conducting connection between the chip 1 and the bonding pad 8 subsequently takes place on the substrate 6. In this example, the connection is made through wire bonds.

After that, a second chip 9, likewise provided on its back side with adhesive pads 2, is applied to the chip 1 and connected to the chip 1 in the same way as described with reference to FIGS. 3a to 3d.

Figure 3E:
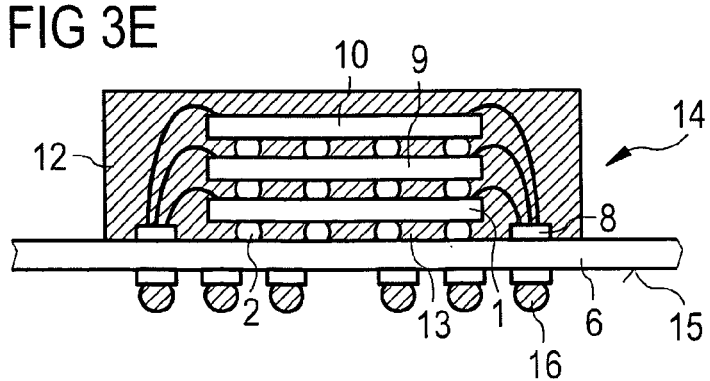
Figure 4:
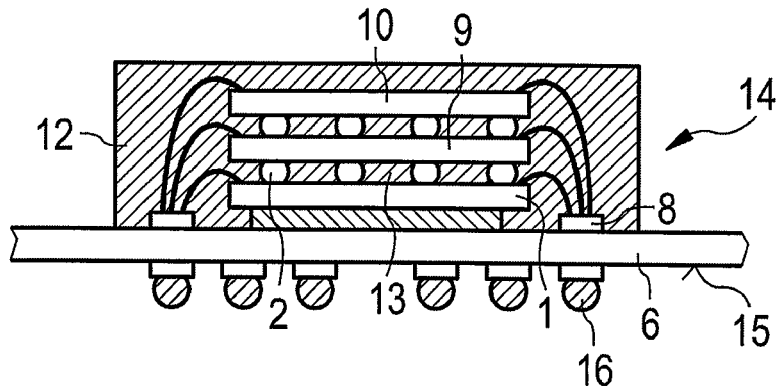
FIG. 4 shows a cross section through a stack with an alternative attachment of the first chip.

As represented in FIG. 3e, the same procedure is followed with a third chip 10.

In a later method step, the stack 11 is then encapsulated with a molding compound 12, the molding compound 12 also getting into the intermediate spaces 13 between the chips 1, 9 and 10 and their respective bases. This transforms the stack 11 into a solid component 14.

Likewise in a further, later method step, this component 14 is then provided with solder balls 16 on the exposed substrate side 15. These solder balls 16 serve for the connection of the component 14 to external wiring that is not shown any more specifically.

Figure 5A:
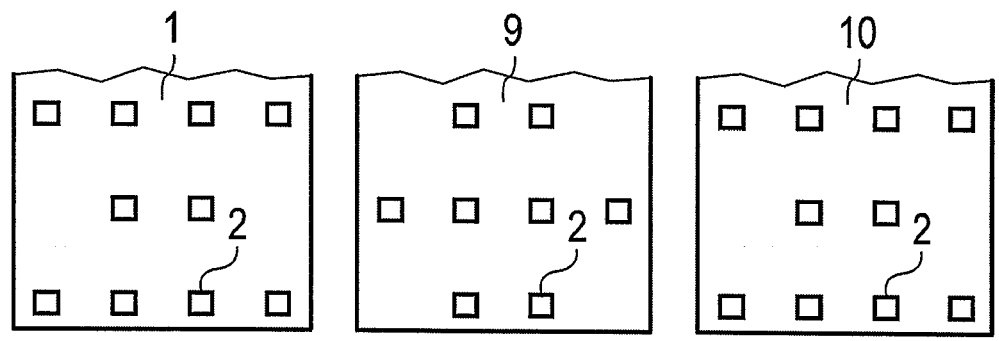
FIGS. 5a and 5b show various patterns of adhesive pads.
Figure 5B:
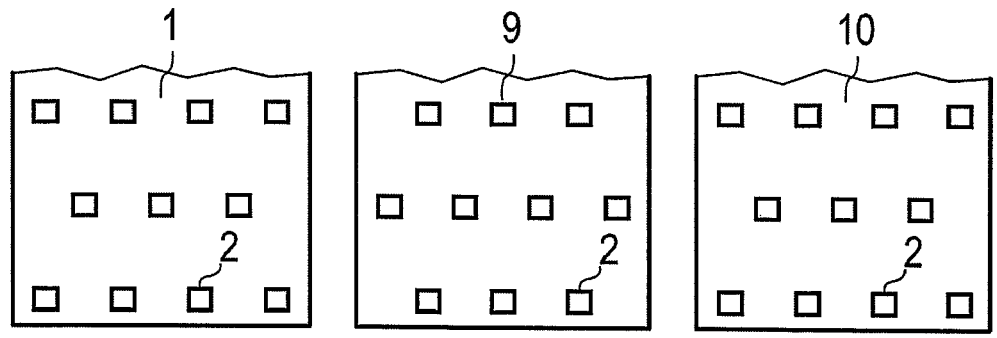

As represented in FIG. 5a, the adhesive pads 2 may have different patterns on the back sides 3 of the chips 1, 9 and 10. Alternatively, the different patterns may be complementary patterns on the back sides 3 of chips 1, 9 and 10 as shown in FIG. 5b.

What is claimed is:

1. A method of packaging a chip, the method comprising:
   providing a chip and a base;
   applying adhesive pads to at least one of a side of the chip or a side of the base;
   performing a first heat-treatment to solidify the adhesive pads, the first heat-treatment being performed at a first temperature at which the adhesive pads solidify without losing adhesive properties;
   joining the chip and the base and aligning the chip to make it coplanar in relation to the base;
   after or while joining the chip and the base, exposing the adhesive pads to a second temperature at which the adhesive pads respectively bond with a previously not yet connected side;
   performing a second heat-treatment to cause the adhesive pads to set, the second heat-treatment being performed at a third temperature at which the adhesive pads completely solidify, whereby the chip is firmly connected to the base; and
   after performing the second heat-treatment, providing a molding compound to the chip and the base, such that the molding compound penetrates into intermediate spaces between the chip and the base.

2. The method as claimed in claim 1, wherein the adhesive pads comprise a pasty thermosetting adhesive.

3. The method as claimed in claim 1, wherein the base comprises a substrate of a ball grid array.

4. The method as claimed in claim 1, and further comprising attaching a second chip over the chip, wherein the molding compound penetrates into intermediate spaces between the second chip and the chip.

5. The method as claimed in claim 4, wherein attaching the second chip over the chip comprises:
   applying adhesive pads to at least one of the chip or the second chip;
   performing a third heat-treatment to solidify the adhesive pads, the third heat-treatment being performed at the first temperature such that the adhesive pads solidify without losing its adhesive properties;
   joining the second chip and the chip and aligning the second chip to make it coplanar in relation to the chip; and
   after or while joining the chip and the second chip, exposing the adhesive pads to the second temperature at which the adhesive pads bond with the previously not yet connected side.

6. The method as claimed in claim 1, wherein the adhesive pads are applied by means of a screen printing process.

7. The method as claimed in claim 1, wherein the adhesive pads are applied by means of a structured tape.

8. The method as claimed in claim 1, wherein the adhesive pads are applied while the chip is still in an assembly with a number of chips from a wafer.

9. The method as claimed in claim 8, wherein each chip includes a re-routing layer on a front side but no re-routing layer on a back side, wherein the adhesive pads are applied to the back side of the chips after a grinding-thin process, the re-routing layer being covered with a protective film while the adhesive pads are applied.

10. The method as claimed in claim 8, wherein the adhesive pads are applied to a front side of the chips, on which a re-routing layer is located.

11. The method as claimed in claim 10, wherein the adhesive pads are applied before application of a grinding tape before a grinding-thin process.

12. The method as claimed in claim 1, wherein the adhesive pads are applied while the chip is in an assembly with a number of chips on a carrier film.

13. The method as claimed in claim 12, wherein the adhesive pads are applied to a front side of the chips, on which a re-routing layer is located.

14. The method as claimed in claim 13, wherein the adhesive pads are applied after separation of the chips from a wafer assembly, while the chips are on a dicing tape.

15. The method as claimed in claim 1, wherein the adhesive pads are applied by means of a template to an upper side of the base.

16. The method as claimed in claim 1, further comprising electrically coupling the chip with the base.

17. A method for mounting a chip on a base in which a multiplicity of adhesive pads that are spaced apart from one another are introduced between a substrate of the chip and the base and are used to connect the chip to the base while setting an intermediate space between the chip and the base, wherein the chip is electrically connected to interconnects of the base and, subsequently, the chip and the base are provided with a molding compound, the intermediate space between the chip and the base being filled with the molding compound, the method comprising:

applying the adhesive pads to a side of the chip facing the base or to a side of the base facing the chip, the adhesive pads comprising a pasty thermosetting adhesive material;

solidifying the adhesive pads in a first heat-treatment step at a first temperature, the first temperature being specific to the adhesive material and at which the adhesive material solidifies without losing its adhesive properties;

placing the chip on the base and aligning the chip such that the chip is coplanar in relation to the base by means of a bonding tool, while applying a bonding force, the adhesive pads being exposed to a second temperature that is specific to the adhesive material and at which the adhesive pads bond with a previously not yet connected side;

setting the adhesive pads in a second heat-treatment step at a third temperature, the third temperature being specific to the adhesive material and at which the adhesive material completely solidifies, thereby firmly connecting the chip to the base; and after setting the adhesive pads, providing the chip and the base with molding compound, wherein the molding compound penetrates into intermediate spaces between the chip and the base.

18. A method of making an electronic component, the method comprising:

attaching a chip to a base with a plurality of adhesive pads that are spaced apart from one another and are arranged in an intermediate space between the chip and the base, the chip being electrically connected to interconnects of the base, wherein the adhesive pads are partitioned in a regular distribution over an entire surface area of the chip;

attaching at least one additional chip over the chip, the at least one additional chip being connected in an electrically conducting manner to the chip and/or the base, wherein attaching the at least one additional chip comprises attaching the at least one additional chip to the chip by a second plurality of adhesive pads, the second plurality of adhesive pads being arranged in a pattern that is different than a pattern in which the plurality of adhesive pads is arranged; and surrounding the chip with a molding compound disposed in the intermediate space between the chip and the base, the intermediate space between the chip and the base being filled with the molding compound, wherein the chip is encapsulated, and wherein surrounding the chip with the molding compound also includes surrounding the at least one additional chip with the molding compound.

19. The method as claimed in claim 18, wherein the base comprises a substrate of a ball grid array (BGA) package.

20. The method as claimed in claim 18, wherein at least some of the adhesive pads are attached to the chip at locations under bonding pads of the chip.

21. The method as claimed in claim 18, wherein the base includes a bonding channel that is arranged such that electrically conducting connections between the chip and the interconnects of the base extend through the bonding channel, the adhesive pads being arranged in symmetrical distribution on both sides of the bonding channel.

22. The method as claimed in claim 18, wherein the at least one additional chip is attached to the chip in a different manner than that with which the chip is attached to the base.

23. The method as claimed in claim 18, wherein the patterns of the plurality of adhesive pads and of the second plurality of adhesive pads are complementary.

24. The method of claim 18, wherein the adhesive pads are arranged on a back side of the chip.

* * * * *